United States Patent [19]
Goldman

[11] 4,427,838
[45] Jan. 24, 1984

[54] DIRECT AND DIFFUSED SOLAR RADIATION COLLECTOR

[76] Inventor: Arnold J. Goldman, 55 Bar Kochva St., Jerusalem, Israel

[21] Appl. No.: 271,959

[22] Filed: Jun. 9, 1981

[51] Int. Cl.³ .......................... H01L 31/04; F24J 3/02
[52] U.S. Cl. .................................... 136/248; 136/246; 136/247; 126/424; 126/435; 126/438
[58] Field of Search ...................... 136/246, 247, 248; 126/424, 435, 438

[56] References Cited
U.S. PATENT DOCUMENTS

| | | | |
|---|---|---|---|
| 4,171,003 | 10/1979 | Forrat | 136/247 |
| 4,210,463 | 7/1980 | Escher | 136/246 |
| 4,220,136 | 9/1980 | Penney | 126/424 |

Primary Examiner—Aaron Weisstuch
Attorney, Agent, or Firm—Spensley, Horn, Jubas & Lubitz

[57] ABSTRACT

A high concentration solar energy collector is provided which collects diffused solar radiation as well as direct solar radiation. A reflector focuses direct radiation onto a first collector and reflects a substantial portion of the diffused radiation onto a second collector positioned near the focus of the reflector.

13 Claims, 5 Drawing Figures

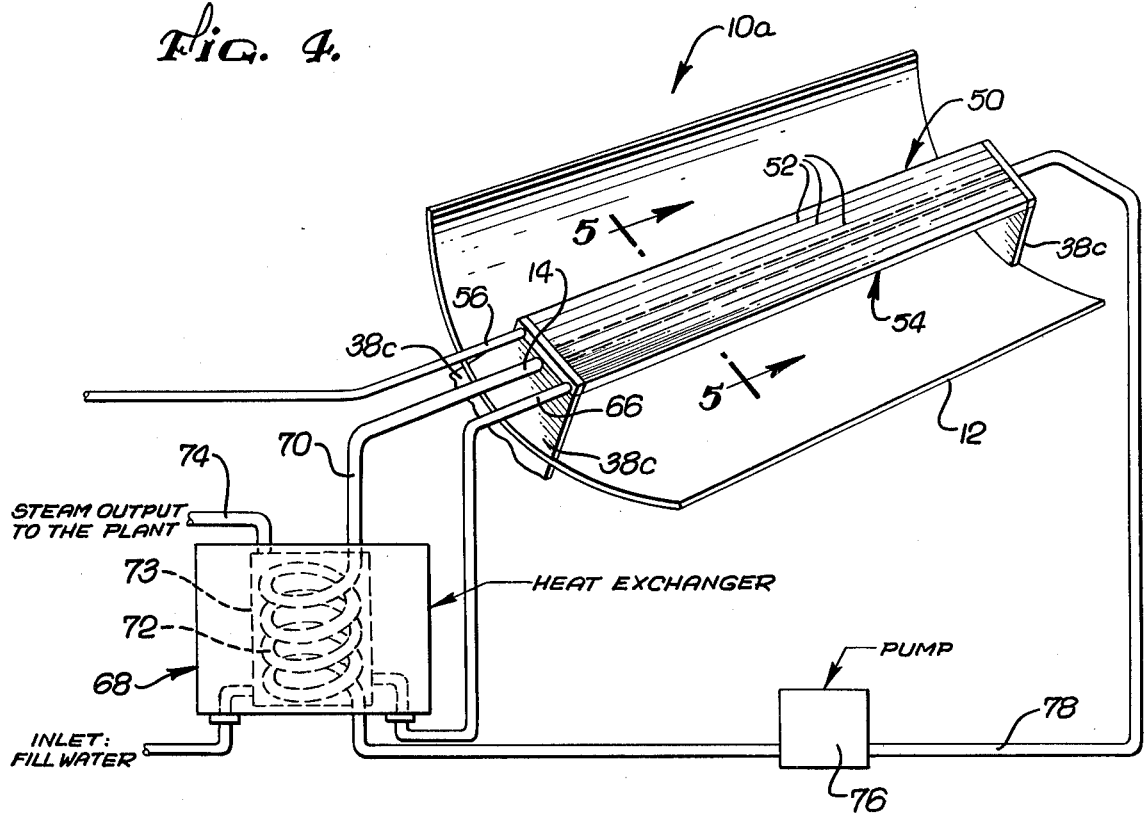
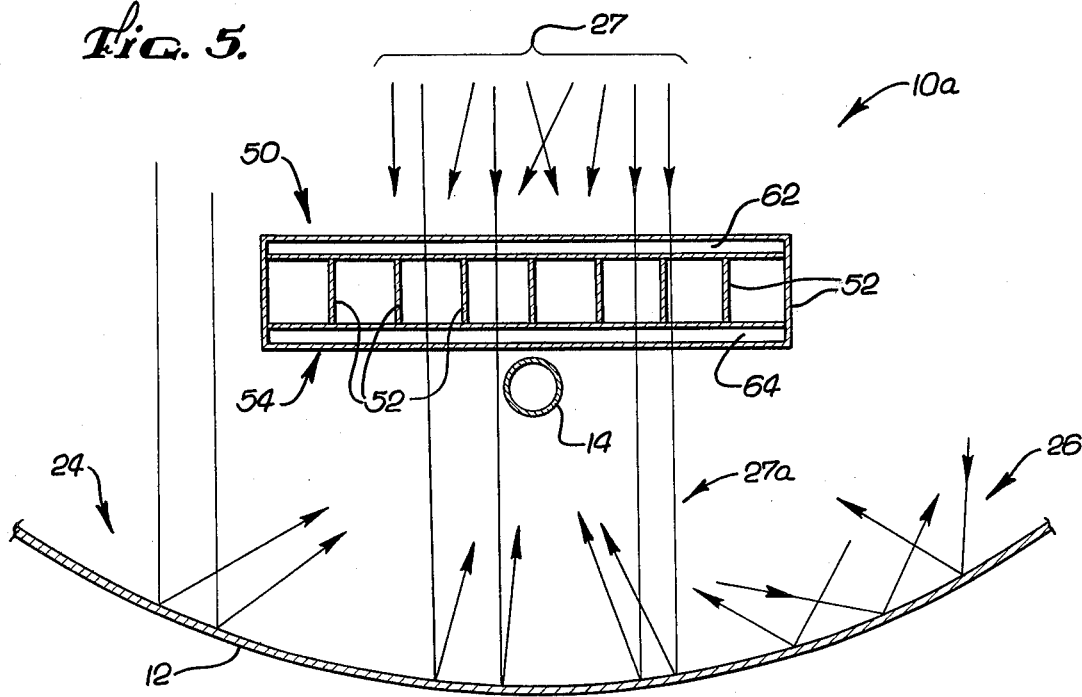

DIRECT AND DIFFUSED SOLAR RADIATION COLLECTOR

BACKGROUND OF THE INVENTION

The present invention relates to solar energy collectors and more particularly to concentrating solar energy collectors which concentrate incident sunlight onto an element.

Solar energy collectors generally transform incident solar radiation to another energy form, typically heat or electricity. Two principal types of collectors are concentrating collectors and flat panel collectors. Concentrating collectors typically have a curved reflector or lens which is positioned to focus incident solar radiation onto a collection element such as a heat absorption pipe or photovoltaic cell. Flat panel collectors, as the name suggests, are flat and generally do not concentrate the incident energy onto the collection element. In systems where solar radiation is converted into heat energy, hereinafter referred to as "thermal collection" systems, the heat energy is often used to heat a working fluid such as water. The working fluid is typically carried within a heat absorption pipe or is otherwise carried in close physical proximity to some other heat collection element.

Concentrating solar energy collectors can have several significant advantages over flat panel collectors, particularly in high temperature thermal collection applications. One such advantage is that it is generally possible to raise the working fluid in a concentrating collector to a higher temperature than that which is typically obtained by a flat collector. This is attributable to the ability of concentrating collectors to provide a greater amount of energy per unit area of the heat collection element than that typically obtained with unconcentrated sunlight. Second, the heat absorption pipe can be significantly more expensive per unit area than the cost of the reflecting material which is used to concentrate the solar radiation onto the heat absorption pipe. Hence, fewer pipes may be used with a resultant cost saving. Furthermore, convection and conduction heat losses are related to the total surface area of the heat collection element and therefore can be significantly greater in non-concentrating systems where the size or the number of the collection elements is typically much greater.

Concentrating solar collectors have a range of "concentration ratios" which compare the total collecting area of the collector to the collection element cross-sectional area on which the radiation is focused. These ratios are often measured in units of "suns". Concentrating collectors with concentration ratios of four suns to one or less are often referred to as low concentration collectors. On the other hand, high concentration ratio collectors can range as high as 20 suns to one, to 60 suns to one, or even higher.

A disadvantage experienced with high concentration collectors has been the failure of the high concentration collectors to utilize the diffused component of the incident solar radiation. Solar radiation is generally comprised of two components, direct radiation, which generally travels in parallel paths, and diffused radiation which is scattered. The direct radiation component can be focused accurately by various types of lenses or reflectors. The diffused radiation component, which can constitute from 12% to 25% of the total incident radiation depending upon atmospheric conditions, typically cannot be accurately focused. Because flat collectors are inherently able to collect diffused radiation, many research efforts have concerned themselves exclusively with low concentration or flat panel collectors, feeling there was a fundamental 12 to 25% energy collection advantage over high energy concentration collectors.

Concentrating collection systems are usually mounted onto sun tracking mechanisms which maintain the collectors pointed at the sun as the sun appears to move across the sky. The generally higher temperatures possible with a tracking thermal collection system can justify the additional expense. This has not generally been the case with photovoltaic systems or other systems which convert solar radiation directly to electricity. The additional electricity produced generally has not economically justified mounting these systems on a sun tracking structure.

SUMMARY OF THE INVENTION

It is an object of the present invention to provide a concentrating solar energy collection system obviating, for practical purposes, the above-mentioned limitations, particularly in a manner requiring a relatively uncomplicated mechanical arrangement.

A preferred embodiment of the present invention provides a solar energy collecting apparatus for collecting direct radiant energy having parallel paths as well as diffused radiant energy from the sun, comprising a first absorption means for absorbing direct radiant energy and transforming the collected direct radiant energy into another form, and a second absorption means for absorbing diffused radiant energy and transforming the collected diffused radiant energy into another form. The apparatus further comprises reflector means for reflectively concentrating direct radiant energy onto said first absorption means at a concentrating ratio of at least 20 suns to one and for reflecting diffused radiant energy onto said second absorption means. Thus, a high concentration solar collector is provided which can collect diffused radiant energy as well as direct radiant energy and is thereby inherently more efficient than previous high concentration collectors. Accordingly, solar energy collectors can be produced which can output more energy for a given size collector. This can be very important for applications in which a limited space is available such as building roof-tops and the like. Furthermore, collectors can be made smaller without impairing their energy output resulting in a possible cost saving.

These and other advantages will become more apparent in the following detailed description and accompanying drawings.

BRIEF DESCRIPTION OF THE DRAWINGS

FIG. 4 is a pictorial view of still another alternative embodiment of the collector of FIG. 1; and FIG. 5 is a sectional view along the line 5—5 of the collector of FIG. 4.

DETAILED DESCRIPTION OF THE DRAWINGS

Figure 1:
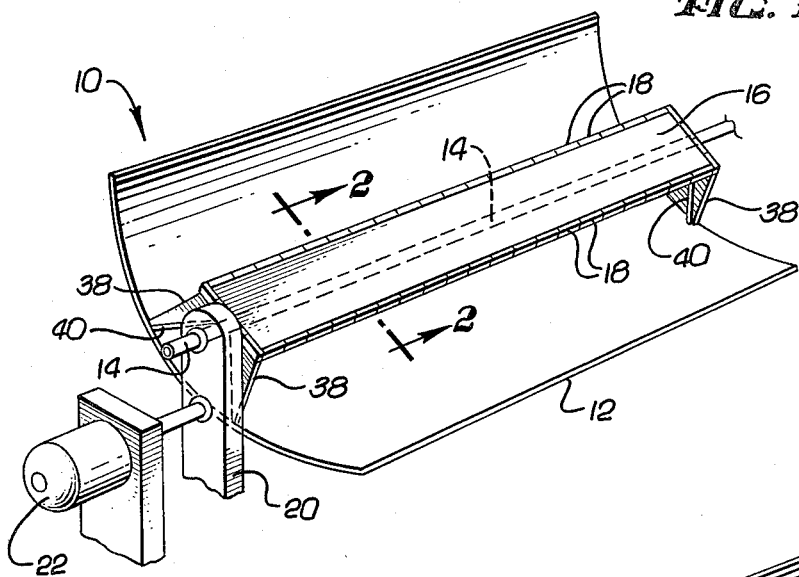
FIG. 1 a pictorial view of a diffused radiation collector employing a preferred embodiment of the present invention.

With reference to FIG. 1, a preferred embodiment of the present invention is schematically shown to comprise a solar energy collector indicated generally at 10. The collector 10 comprises a parabolic trough reflector 12 which reflects incident direct radiation, which travels in parallel paths, onto a heat collection element shown as a heat absorption pipe 14 in the illustrated embodiment. The pipe 14 is mounted at the focus of the reflector 12 and absorbs the direct radiation reflected onto it and transforms the collected direct radiant energy into another form, here heat. A working fluid, such as water, flows through the pipe 14 and is heated by the direct radiant energy concentrated onto the heat absorption pipe 14. It is recognized that other means for absorbing the concentrated direct radiant energy reflected by the reflector 12 and transforming the collected radiant energy into a usable form may be used.

The collector 10 of the illustrated embodiment also has a flat fluorescent panel 16 framed with a contiguous ring of solar cells indicated at 18, for absorbing diffused radiant energy as well as direct radiant energy and transforming the collected energy into another form which in this embodiment is electricity. Alternatively, the fluorescent panel 16 may be coupled to a different conversion element to transform the collected energy to another form such as heat, for example. The function of the fluorescent panel 16 is more fully explained below.

The reflector 12 is rotatably mounted on a pedestal 20. A motor 22 is mechanically linked through the pedestal 20 to the reflector 12 to slowly rotate the reflector 12 so that the collector 10 can track the sun as the sun appears to move across sky. This maximizes the amount of radiant energy or sunlight entering the collector 10, which generally is approximately 30% greater than the incident sunlight striking a stationary system.

The collector 10 has an aperture defined by the width and length of the parabolic reflector 12 through which the solar radiation enters the collector 10 which defines the effective solar radiation collecting area of the collector 10. The cross-sectional area of the heat absorption pipe 14 measured in a plane parallel to the plane of the aperture is small compared to the area of the aperture of the collector 10. In particular, the illustrated embodiment has a concentration ratio in excess of 20 suns to one and is, therefore, a high concentration ratio collector.

Figure 2:
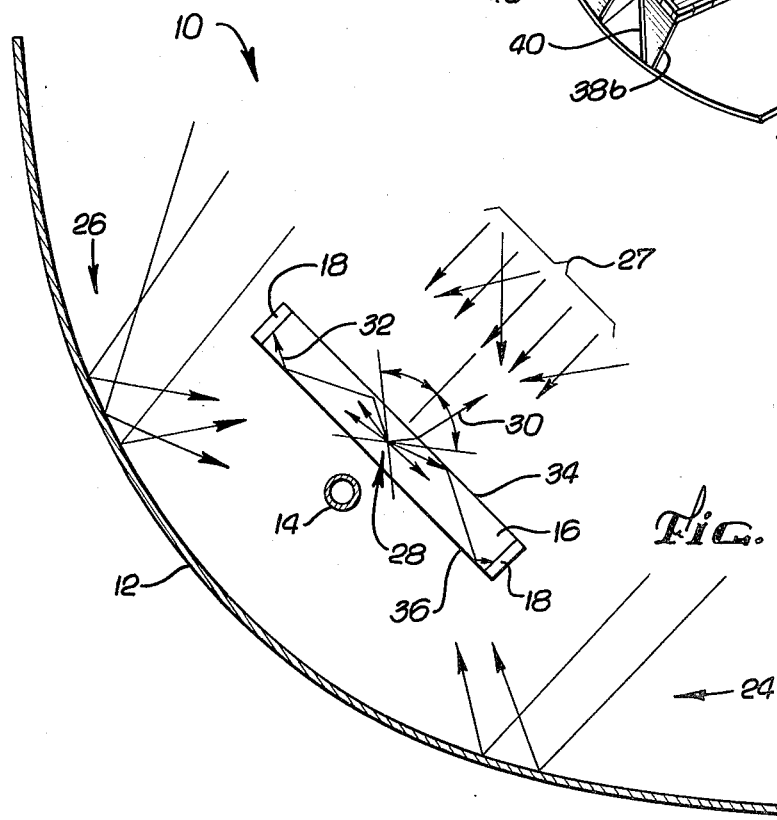
FIG. 2 is a sectional view along the line 2—2 of the collector of FIG. 1.

Referring now to FIG. 2, direct radiation which enters the aperture of the reflector 12 is reflected by the highly reflective surface of the reflector 12 and concentrated onto the heat absorption pipe 14, as represented by the arrows indicated generally at 24. The reflector 12 has a parabolic cross-section which defines a focus, the heat absorption pipe 14 being located at the focus as previously noted. The diffused radiation entering the aperture of the reflector 12 generally is not reflected to the focus of the reflector. Instead, it has been found that approximately 80% of the diffused light incident on the reflecting surface of the reflector 12 (as represented by the arrows indicated at 26) is reflected back to a region equal to approximately ¼ of the aperture of the collector, centered at the focus. More particularly, this region, in the illustrated embodiment, has a width equal to one fourth the width of the aperture and a length coextensive with the aperture length and is centered with respect to the focus.

Accordingly, the panel 16 is designed to have the same approximate dimensions and is located to substantially occupy the region in order to intercept a substantial portion of the reflected diffused light. It is recognized that the particular dimensions of the diffused radiation collection element may vary and yet intercept a substantial portion of the diffused light.

The panel 16 is often made of glass or plastic which contains a fluorescent material such as organic or inorganic dye distributed throughout the glass or plastic. Other types of fluorescent panels may be used such as rare earth doped glass or an organic solvent sandwiched between transparent plates. Incident sunlight (either direct or diffused as represented by the arrows at 27) which penetrates the fluorescent panel 16 causes the embedded material to fluoresce. As the material fluoresces, light is emitted generally in all directions, an example of which is indicated at 28. Further details of the composition and properties of the fluorescent glass may be found in J. S. Batchelder, A. H. Zewail, and T. Cole, "Luminescent Solar Collectors", *Applied Optics*, 18, No. 18 (Sept. 15, 1979); W. H. Weber and J. Lambe, "Luminescent Greenhouse Collector for Solar Radiation", *Applied Optics*, 15, No. 10, (October 1976); Eli Yablonovitch, "Thermodynamics of the Fluorescent Planar Collector", *Journal of the Optical Society of America*, 70, No. 11 (November 1980); A. Goetzberger and W. Greubel, "Solar Energy Conversion with Fluorescent Collectors", *Applied Physics*, 14, 123–139 (1977); A. Goetzberger, "Thermal Energy Conversion with Fluorescent Collector-Concentrators", *Solar Energy*, 22, 435–438 (1979).

Light which is emitted from a fluorescent point at less than a particular angle with respect to the normal (often referred to as the "critical angle"), leaves the panel at a refracted angle as represented by the arrow 30. The illustrated embodiment is shown to have a critical angle of 30° with respect to the normal which will vary, of course, depending upon the properties of the particular medium used.

Light emanating from the fluorescent point at an angle greater than 30° with respect to the normal will be internally reflected and propagate down the glass toward a solar cell 18 as represented by the arrow 32. The light is propagated using the same principle as communication fiberoptics. The solar cells 18 are photovoltaic cells and have their active surfaces facing towards the edge of the fluorescent panel 16 to receive the propagated light and convert it to electricity. In this manner, solar radiation entering the panel 16 is concentrated onto the solar cells 18. The fluorescent materials embedded in the panel are selected to emit fluorescent light in a frequency range which is matched with the band gap of the solar cells 18 in order to maximize the amount of energy converted to electrical energy. Although the panel 16 in the illustrated embodiment is flat, it is recognized that the fluorescent panel 16 may be curved or have other shapes.

As noted above, the panel 16 has a width equal to ¼ the width and is equal in length to the aperture of the collector 10 to collect as much as 80% of the reflected diffused light. The fluorescent panel and solar cell array assembly is shown in FIG. 1 to be mounted on the reflector 12 by means of a set of struts 38 which rigidly hold the assembly and reflector 12 together as the reflector slowly rotates following the sun. In a similar manner, a set of struts 40 rigidly holds the heat absorption pipe 14 at the focus of the reflector 12.

Figure 3:
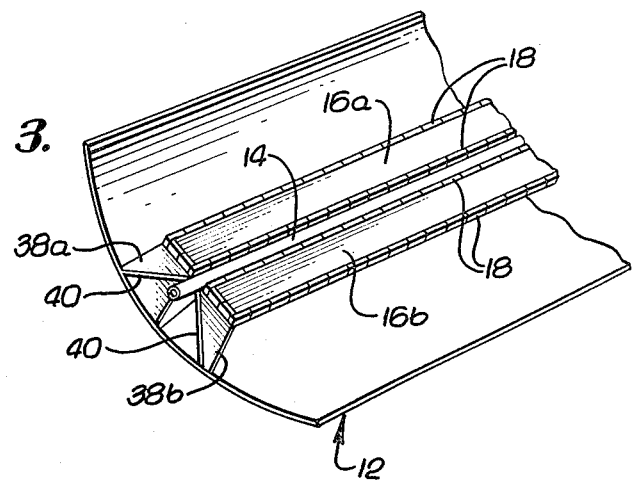
FIG. 3 is a partial pictorial view of an alternative embodiment of the collector of FIG. 1.

The optimum placement of the panel 16 is centered with respect to the focus of the reflector 12 and coplanar with the focus as illustrated in FIG. 3. However, since the heat absorption pipe 14 is also placed at the focus, the placement of the panel 16 may necessitate the splitting of the panel into two portions designated 16a and 16b. Also, a somewhat more complicated support structure such as the struts 38a and 38b may be necessary.

In order to avoid this, the fluorescent panel 16 is mounted a few centimeters above the heat collection element 14 as shown in the embodiment of FIGS. 1 and 2. In this manner, the collector 10 is somewhat simpler to construct without significantly degrading the efficiency of the device.

A major advantage of the illustrated embodiment results from the reflected diffused solar radiation which strikes the underside 36 of the fluorescent panel 16. In addition to the solar radiation (direct and diffused) incident upon the upper surface 34 of the panel 16, approximately 80% of the diffused radiation incident on the surface of the reflector is reflected back to a region equal to ¼ of the aperture of the reflector 12 where the panel 16 is placed. Thus, approximately 80% of the diffused radiation incident on the surface of the reflector 12 will strike the underside 36 of the fluorescent panel 16 and large percentages of that incident radiation will not be lost but will be converted to electrical energy. In this manner, the reflected diffused radiation entering the underside 36 and the direct and diffused radiation entering the upper surface 34 of the panel 16 are concentrated onto the solar cells 18 and converted into electricity.

With the glass panel 16 and heat absorption pipe 14 attached to the reflector 12 so that they track the sun movement along with the reflector 12, the reflector 12 and the upper surface 34 of the fluorescent glass 16 are exposed to a maximal amount of direct and diffused radiation. In addition to the increase in energy resulting from the collection of diffused light, the illustrated embodiment offers an additional energy gain resulting from the tracking of the sun.

As noted before, the economics of solar collectors is such that it generally does not justify the added expense of mounting photovoltaic collectors on a sun tracking structure. However, the economics of thermal systems give significant added value to the higher temperature fluids resulting from a tracking solar thermal system. Thus, it has been desirable to build tracking thermal systems but not desirable to build a tracking solar cell array system. Because the illustrated embodiment described herein is a hybrid system that can produce generally in excess of 80% of its total output energy in the form of a hot fluid which can range from 150° to 300° centigrade, it is, therefore, principally a thermal system and sun tracking is justified on that basis. The added cost of installing the fluorescent panel 16 onto the collector 10 so that it also will track the sun is relatively small. However, the incident sunlight striking the upper surface of the fluorescent panel 16 can be as high as 30% greater than the incident sunlight striking the upper surface of a stationary system.

If it is estimated that 12% of the total incident sunlight entering the aperture of the collector 10 is diffused light and that 80% of the diffused light entering the aperture and not blocked by the fluorescent panel 16 is reflected onto the lower surface of the panel 16, then it can be estimated that the diffused light reflected onto the lower surface of the panel 16 will equal as much as 28% (3×12%×80%) of the total sunlight incident on the upper surface. (The portion of the aperture not blocked by the fluorescent panel 16 is approximately three times the upper surface area 34 of the fluorescent panel 16.) If the diffused component of the sunlight is as high as 25% of the total sunlight, then the incident light on the lower surface of the fluorescent panel 16 will equal approximately 56% of the total incident sunlight on the upper surface of the fluorescent glass 16. Taking into account a 30% increase in incident sunlight with a tracking system, the incident sunlight on the lower surface 36 of the fluorescent panel 16 can range from 36% (1.30×28%) to as high as 72% (1.30×56%) of the incident sunlight striking the upper surface of a stationary solar collector panel.

An alternative embodiment of the collector is schematically shown in FIG. 4 to comprise a collector indicated generally at 10a which has a parabolic reflector 12 and a heat absorption pipe 14 similar to that shown in FIG. 1. Instead of the fluorescent panel 16 and solar cells 18, the collector 10a has a second heat collection element 50 for absorbing diffused radiant energy and transforming the collected diffused radiant energy into heat for heating a fluid flowing through the element 50.

The second heat collection element 50 comprises a plurality of parallel planar strips 52 which are mounted within a transparent box-shaped housing 54. The housing 54 has the same general dimensions as the fluorescent panel 16 of FIG. 1 in that it too occupies approximately ¼ of the aperture of the reflector 12 centered about the focus. The planar strips 52 are made of aluminum and are coated with a thick energy absorbing coating such as black chrome in the illustrated embodiment, but other materials with suitable energy absorbing properties may be used.

A second working fluid such as water is admitted into the housing 54 through an inlet 56 which may, for example, be connected to the municipal water supply. The water flows through the housing 54 between the planar strips 52 to be heated by the strips 52 which have absorbed the diffused light reflected by the reflector 12.

A cross-section of the collector 10a is shown in FIG. 5 which further illustrates the operation of the collection 10a. The planar strips 52 are mounted vertically and parallel within the housing 54 so that direct radiation from the sun will pass through the transparent housing 54 and the fluid between the planar strips 52 largely undisturbed as represented by the arrows at 27a. The collector 10a has a tracking motor 22 (not shown) mechanically linked to the reflector 12 in a manner similar to that shown in the embodiment of FIG. 1. The tracking mechanism maintains the reflector and heat collection elements pointed toward the sun so that the amount of radiation entering the aperture of the reflector 12 is maximized. In addition, the planar strips 52 are maintained parallel to the paths of direct radiation, allowing the direct radiation to pass between the planar strips 52. Thus, the direct radiation entering the reflector 12 either through or outside the second heat collection element 50 is reflected by the reflector 12 and focused onto the first heat collection element 14 as represented by the arrows indicated at 27a and 24.

The working fluid passing within the heat absorption pipe 14 is heated to a very high degree just as in the embodiment of FIG. 1. Furthermore, a large percentage (approximately 80%) of the diffused radiation entering the aperture of the reflector 12 (represented at 26) is reflected to the second heat collection element 50. Also, the strips 52 of the collection element 50 directly absorb a significant portion of the diffused radiation component of the radiation indicated at 27. The housing 54 has a double wall construction which defines a first air gap 62 between the upper surface of the housing 54 and the planar strips 52 and a second air gap 64 between the lower surface of the housing 54 and the planar strips 52 which insulates the strips 52 and the water passing between to help prevent heat loss.

Referring back to FIG. 4, the heated water passing through the heat collection element 50 exits through an outlet 66 and is conducted to a heat exchanger 68 for additional heating. The outlet of the heat absorption pipe 14 is connected by a conduit 70 to a coil 72 within the heat exchanger 68. The collector inlets and outlets are connected to the exchanger 68 through flexible conduits or rotary joints (not shown) to allow the collector 10 to rotate.

The highly heated fluids from the heat absorption pipe 14 pass through the coil 72 which is surrounded by the water from the second heat collection element 50 contained within a jacket 73. The water is further heated by the very hot fluids within the coil 72 and then exits through an outlet 74 to be used. The working fluid of the heat absorption pipe 14 is returned from the coil 72 by a pump 76 which is connected by a conduit 78 to the return inlet of the heat absorption pipe 14 for recycling and further heating. It is recognized that other methods and apparatus may be implemented to utilize the energy collected from the diffused radiation as well as the direct radiation.

The second heat collection element 50 is schematically shown mounted on struts 38c in a manner similar to that shown for the panel 16 of FIG. 1 so that the heat collection element 50 is centered in the aperture of the reflector 12. The heat collection element 50 is mounted as close as practical to the focus of the reflector 12 so that the maximum amount of diffused light is intercepted for a given cross-sectional area of the element 50. In the illustrated embodiment, the element 50 is mounted a few centimeters above the heat absorption pipe 14.

Thus it can be seen from the foregoing that a solar energy collector constructed in accordance with the present invention can increase the efficiency and the energy output of a concentrating collector without increasing the size or aperture of the reflector. Very high temperatures can be attained with a high concentration collector yet the diffused radiation is not wasted. Furthermore, a practical tracking photovoltaic system is provided which benefits from the increased efficiency of collecting the diffused radiation as well as the increased efficiency resulting from tracking the sun.

It will, of course, be understood that modifications of the present invention in its various aspects, will be apparent to those skilled in the art, some being apparent only after study and other being merely matters of routine mechanical design. As such, the scope of the invention should not be limited by the particular embodiments and contruction herein described but should be defined only by the appended claims and equivalents thereof.

Various features of the invention are set forth in the following claims.

I claim:

1. A solar energy collecting apparatus for collecting direct radiant energy having parallel paths as well as diffused radiant energy from the sun, said apparatus comprising:
    a first absorption means for absorbing concentrated direct radiant energy and transforming the collected direct radiant energy into another form;
    a second absorption means, located adjacent said first absorption means, for absorbing diffused radiant energy and transforming the collected diffused radiant energy into another form, said second absorption means comprising a fluorescent panel and an array of solar cells associated with and circumferentially surrounding said panel such that radiant energy entering the panel causes molecules within the panel to fluoresce with a substantial portion of emitted fluorescent light being internally reflected to the solar cells for conversion to electricity, said panel also being oriented for directly absorbing direct radiant energy from the sun for conversion to electricity; and
    reflector means for reflectively concentrating direct radiant energy onto said first absorption means at a concentration ratio of at least twenty suns to one and for reflecting diffused radiant energy onto said second absorption means, and wherein said reflector means comprises a trough-shaped reflective wall having a substantially parabolic cross-section which defines a focus, said first absorption means being positioned at said focus, and said and second absorption means positioned adjacent said focus.

2. The apparatus of claim 1 wherein said first absorption means comprises a heat collection element centrally located in said second absorption means, whereby the collected direct radiant energy in said first absorption means is transformed into heat energy.

3. The apparatus of claim 1 wherein the reflector means defines an aperture through which direct and diffused radiant energy from the sun enter the reflector means, said second absorption means occupying an area extending approximately one-fourth the width of the aperture, centered with respect to the focus.

4. The apparatus of claim 1 wherein said first absorption means comprises a tube extending longitudinally through said second absorption means.

5. The apparatus of claim 1 further comprising tracking means, associated with said first and second absorption means and said reflector means, for maintaining the first absorption means, second absorption means and reflector means in a substantially constant relationship with respect to the sun.

6. The apparatus of claim 5 wherein said reflector means defines an aperture through which direct and diffused radiant energy from the sun enter the reflector means and said tracking means maintains said aperture substantially normal to the direct radiant energy.

7. The apparatus of claim 1 wherein said fluorescent panel is positioned near the focus and the first absorption means to intersect a substantial portion of the reflected diffused light from the reflector means.

8. The apparatus of claim 1 wherein said reflector means defines an aperture through which radiant energy from the sun enters the reflector means, said panel occupying an area extending approximately one-fourth the width of the aperture, centered with respect to the focus, so that said panel intercepts direct and diffused radiant energy entering into the one-fourth of the aperture centered around the focus and the remaining direct radiant energy entering the aperture is reflectively focused onto the first absorption means and a substantial portion of the remaining diffused light is reflected onto the panel.

9. A solar energy collecting apparatus for collecting direct radiant energy having parallel paths as well as diffused radiant energy from the sun and transferring the collected energy in the form of heat to fluids, said apparatus comprising:

a first heat collector comprising a heat collection pipe for carrying a first fluid within the pipe and for absorbing concentrated direct radiant energy and transferring heat energy to the first fluid;

a trough-shaped reflector having a highly reflective inner surface which has a substantially parabolic cross-section which defines a focus, said reflector defining an aperture through which direct and diffused radiant energy enter to be reflected;

means associated with the reflector and the heat collection pipe for carrying the pipe at the focus of the reflector;

a second heat collector disposed adjacent said first heat collector and comprising an array of planar strips for absorbing diffused radiant energy and transferring heat energy to a second fluid, said array disposed in a transparent box-like housing said housing being oriented transversely to the focal axis of said reflector, whereby direct radiation from the sun passes undistrubed through said housing and said second fluid, means for carrying the second fluid in close physical proximity to the array of strips so that the heat absorbed by the strip array may be transferred to the second fluid;

means associated with the reflector and the array of strips for carrying the array adjacent the reflector surface so that the array intersects a substantial portion of diffused light reflected by the reflector; and means for carrying the heated first fluid from the heat collection pipe near the second fluid whereby the first fluid may further heat the second fluid.

10. The apparatus of claim 9 wherein the strips are positioned parallel to the paths of the direct radiant energy from the sun whereby the direct radiant energy may pass through the array of strips relatively freely.

11. The apparatus of claim 9 wherein said housing has a plurality of walls defining open, longitudinal spaces adjacent said array of planar strips.

12. A solar energy collecting apparatus for collecting direct radiant energy having parallel paths as well as diffused radiant energy from the sun and transferring collected energy in the form of electricity and for transferring collected energy in the form of heat to a working fluid said apparatus comprising:

a high concentration trough-shaped reflector having a highly reflective inner surface which has a substantially parabolic cross-section which defines a focus, said reflector defining an aperture through which direct and diffused radiant energy enter to be reflected;

an absorption pipe for carrying the working fluid within the pipe and for absorbing concentrated direct radiant energy reflected from the reflector and transferring heat energy to the working fluid;

means associated with the reflector and the absorption pipe for carrying the pipe at the focus of the reflector;

a panel of fluorescent glass and an array of solar cells facing the periphery of the panel, said panel for absorbing radiant energy entering the panel wherein molecules within the panel are caused to fluoresce with a substantial portion of emitted fluorescent light being internally reflected to the solar cells for conversion to electricity, said absorption pipe extending along the length of said panel; and means associated with the reflector and the panel for carrying the panel adjacent the reflector surface so that the panel intercepts a substantial portion of diffused light reflected by the reflector said panel also being oriented for directly absorbing said direct radiant energy from the sun for conversion to electricity.

13. The apparatus of claim 12 further comprising tracking means, associated with the reflector, for positioning the reflector with respect to the sun so as to maximize the amount of radiant energy entering the reflector aperture.

* * * * *